United States Patent [19]

Hong

[11] Patent Number: 5,413,949

[45] Date of Patent: May 9, 1995

[54] METHOD OF MAKING SELF-ALIGNED MOSFET

[75] Inventor: Gary Hong, Hsin-chu, Taiwan, Prov. of China

[73] Assignee: United Microelectronics Corporation, Hsinchu, Taiwan, Prov. of China

[21] Appl. No.: 233,339

[22] Filed: Apr. 26, 1994

[51] Int. Cl.6 ................. H01L 21/266; H01L 21/8234
[52] U.S. Cl. ......................................... 437/44; 437/45; 437/46; 437/909; 437/984; 437/931
[58] Field of Search .................. 437/41, 44, 909, 931, 437/984, 45, 46

[56] References Cited

U.S. PATENT DOCUMENTS

| | | | |
|---|---|---|---|
| 5,278,441 | 1/1994 | Kang et al. | 257/371 |
| 5,328,862 | 7/1994 | Goo | 437/41 |

*Primary Examiner*—Olik Chaudhuri
*Assistant Examiner*—Richard A. Booth
*Attorney, Agent, or Firm*—George O. Saile

[57] ABSTRACT

This invention describes a device structure and a method of forming the device structure using a polysilicon spacer formed on the edges of the gate electrode forming a gate structure with a cavity. The channel area is self aligned through this cavity. A fully overlapped Light-Doped-Drain structure is used to improve device characteristics for submicron devices. A deep boron implant region, self aligned through the gate structure, is used to improve punch through voltage.

10 Claims, 3 Drawing Sheets

METHOD OF MAKING SELF-ALIGNED MOSFET

BACKGROUND OF THE INVENTION (1) Field of the Invention

The invention relates to an improved MOSFET device structure and the method of forming the device structure. A polysilicon spacer is formed on the gate electrode forming a gate structure with a cavity. The channel implantation is self aligned through the cavity. A fully overlapped Light-Doped-Drain structure is used to improve device characteristics. Deep boron implants are used to improve punch through voltage.

(2) Description of the Related Art

In using field effect transistors in the formation of integrated circuits increased density and increased performance has long been recognized as having key importance. In addition it is important to maintain high reliability and good device characteristics for submicron applications.

This invention uses self aligning methods to form the critical regions in the device. A fully overlapped Light-Doped-Drain is used to improve device characteristics for submicron devices. A deep boron implant, which is self aligned, is used to improve punch through voltage for short channel devices.

SUMMARY OF THE INVENTION

It is a principle object of this invention to provide an improved MOSFET device structure with improved reliability for use in deep submicron applications. The device structure uses a fully overlapped LDD (Light-Doped-Drain) which has improved device characteristics for submicron devices.

It is a further object of this invention to provide a method of forming an improved MOSFET structure with improved reliability for use in deep submicron applications. The method uses a self aligned channel implantation. The method also uses a deep boron implant to prevent punch through between the source and drain. The deep boron implant is self aligned into the channel region such that is not in contact with the N+ source and drain regions to avoid the increase of body effect, that is the threshold voltage will not change appreciably with substrate bias.

These objects are achieved by means of a device structure formed using a second polysilicon spacer above and in contact with a first polysilicon gate. The first polysilicon gate is formed on a $SiO_2$ gate oxide layer formed on a silicon substrate. The second polysilicon spacer is formed on the edges of the polysilicon gate forming a gate structure with a cavity. The channel implantation is self aligned through the cavity opening. A fully overlapped Light-Doped-Drain structure, which has better device characteristics for submicron devices, is fabricated in combination with blanket N− and N+ source/drain implantations. A deep boron implant is formed beneath the channel region. This deep boron implantation is self aligned through the cavity in the polysilicon gate structure and is self aligned with the channel region. The deep boron implant region improves punch through voltage and is not in contact with the N+ source/drain region so the implant dose will not increase the body effect.

DESCRIPTION OF THE PREFERRED EMBODIMENTS

Figure 1:
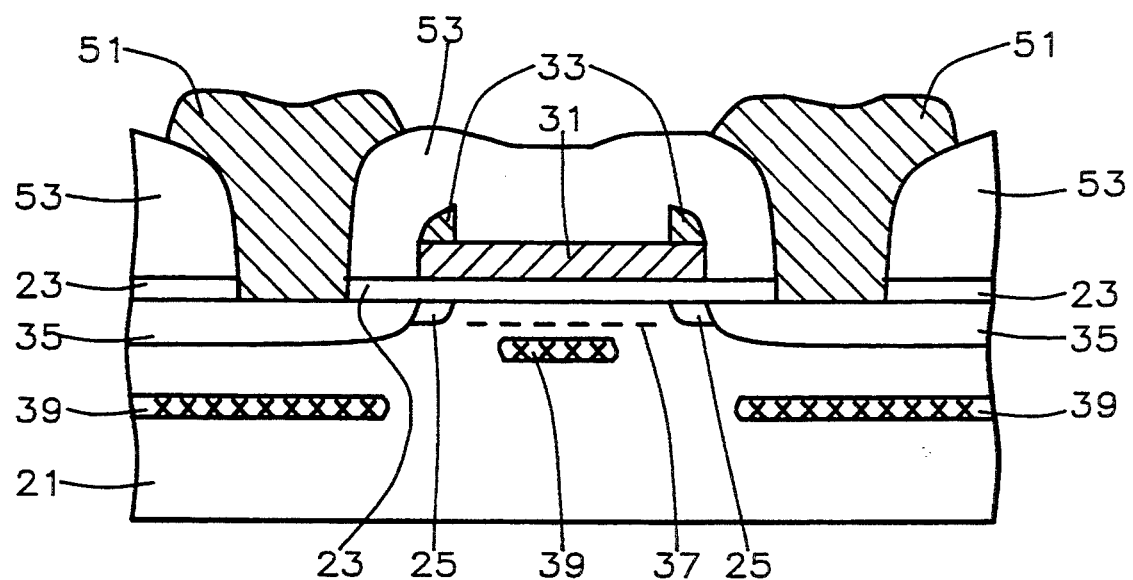
FIG. 1 is a cross sectional view of the completed MOSFET device structure showing source and drain contacts formed through the device passivation layer.

Refer now to FIG. 1, there is shown an embodiment of the improved MOSFET device structure including the device passivation 53 and contacts 51 for the source and drain. The gate oxide layer 23 of $SiO_2$ with a thickness of about 150 Angstroms is formed on the surface of the silicon substrate 21. A gate electrode 31 formed of polysilicon with a doping concentration between about $1 \times 10^{18}/cm^3$ and $1 \times 10^{21}/cm^3$ is formed on the gate oxide layer. A spacer electrode 33 formed of polysilicon with a doping concentration between about $1 \times 10^{18}/cm^3$ and $1 \times 10^{21}/cm^3$ is formed on the edges of the gate electrode forming a gate structure with a cavity. The source/drain areas include N+ regions 35 which end at the edge of the gate electrode and N− regions 25 which extend under the gate electrode as far as the inner edge of the spacer electrode 33. The channel area 37 is a P− region formed by ion implantation through the gate structure cavity so the channel area is self aligned with the gate structure. The deep boron implant P− regions 39 are formed by ion implantation under the channel area 37 and under the N+ regions of the source/drain areas 35 and are self aligned with the gate cavity structure. The passivation layer 53 and the source/drain contacts 51 are formed on the top of the device.

Figure 2:
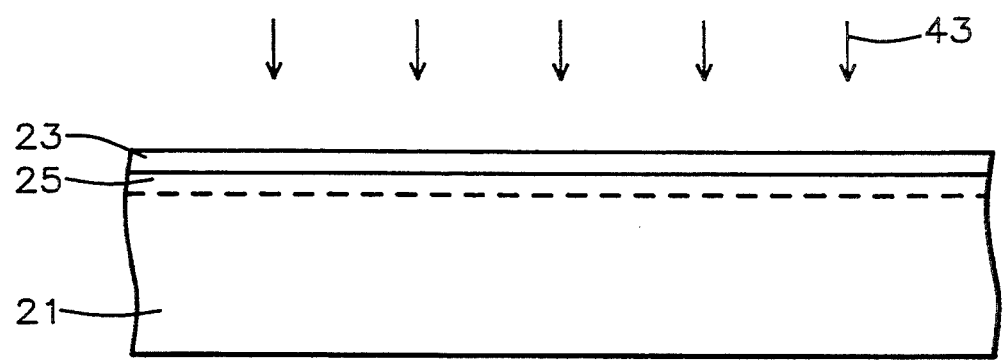
FIG. 2 is a cross sectional view of the gate oxide layer formed on the surface of the silicon substrate showing the blanket phosphorus ion implant beam.

Refer now to FIG. 2 through FIG. 7, there is shown an embodiment of the method of forming the improved MOSFET device structure. FIG. 2 shows a cross sectional view of the silicon substrate 21 with a gate oxide layer 23 of $SiO_2$ with a thickness of about 150 Angstroms formed on the surface of the substrate. An N− layer 25 is formed under the gate oxide layer 23 by means of a blanket phosphorus ion implantation using an ion beam 43 of about $3 \times 10^{13}$ ions/cm² at about 50,000 electron volts.

Figure 3:
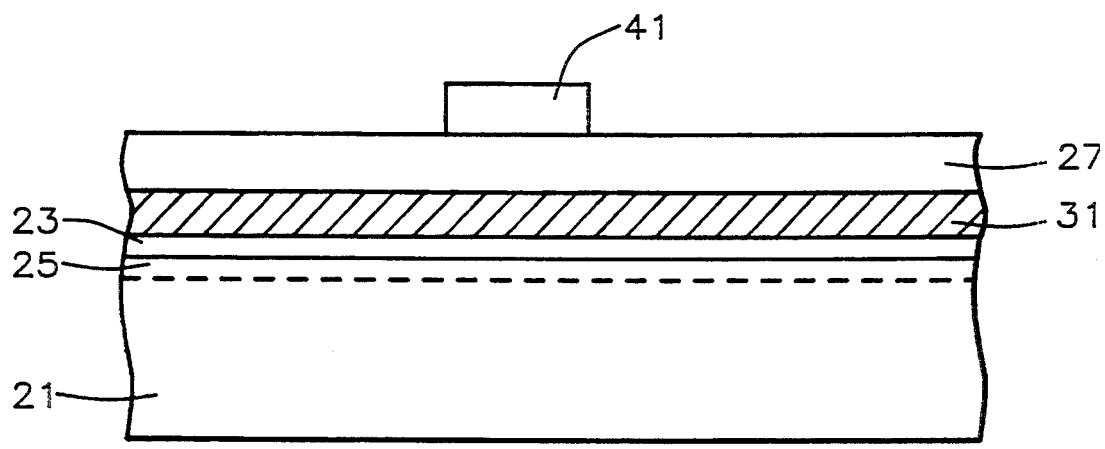
FIG. 3 is a cross sectional view of the photoresist pattern formed on the nitride layer.

FIG. 3 shows a layer of gate electrode polysilicon 31 with a thickness of about 1000 Angstroms and a doping concentration between about $1 \times 10^{18}/cm^3$ and $1 \times 10^{21}/cm^3$ formed on the gate oxide layer 23. A nitride layer 27 of $Si_3N_4$ with a thickness of about 2000 Angstroms is formed on the gate electrode polysilicon layer 31. A patterned photoresist layer 41 is formed on the nitride layer.

Figure 4:
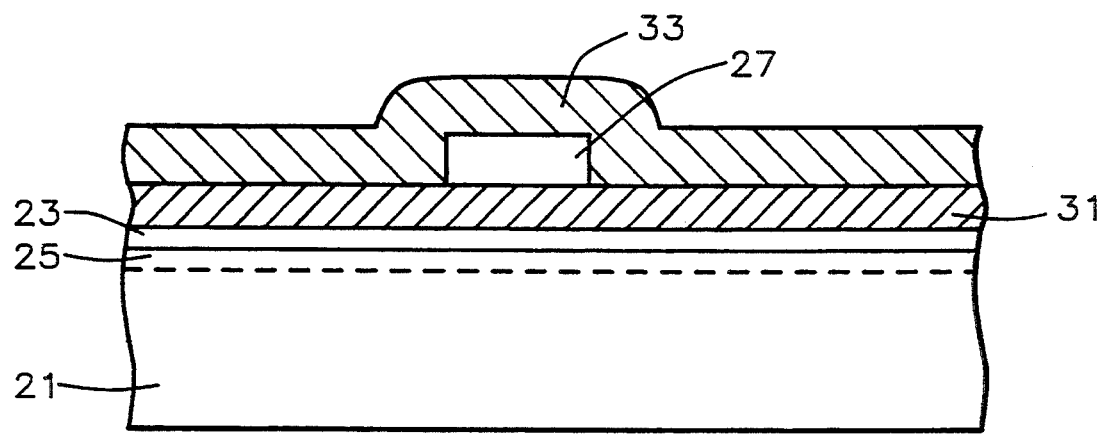
FIG. 4 is a cross sectional view of the second polysilicon layer formed over the patterned nitride layer and the first polysilicon layer.
Figure 5:
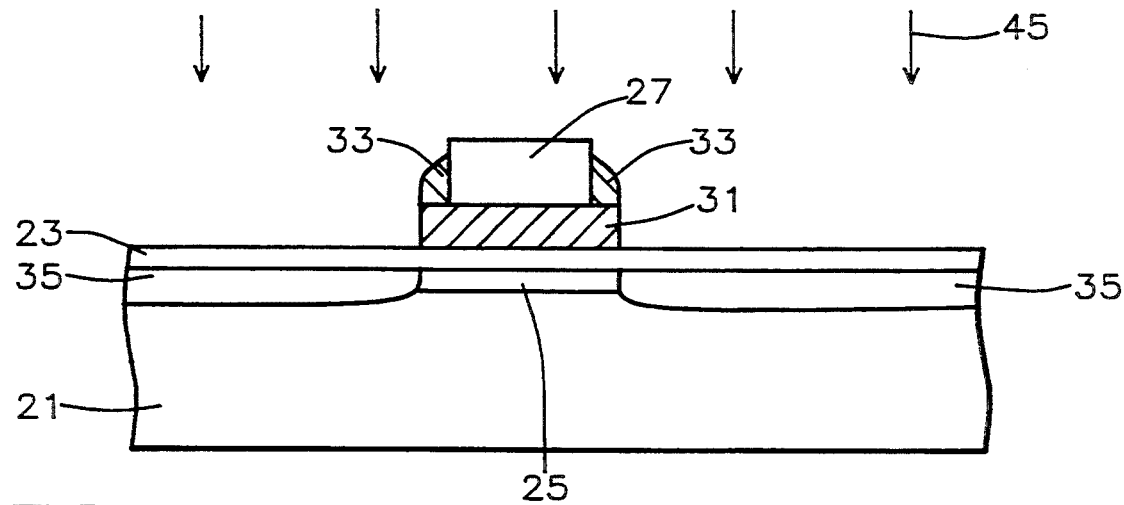
FIG. 5 is a cross sectional view of the device with the first polysilicon layer and second polysilicon layers etched back to their final pattern and showing the blanket arsenic source/drain implantation.

As shown in FIG. 4 the nitride layer 27 is etched to the photoresist pattern and the photoresist is stripped. A spacer polysilicon layer 33 with a thickness of about 2000 Angstroms and a doping concentration between about $1 \times 10^{18}/cm^3$ and $1 \times 10^{21}/cm^3$ is formed on the gate polysilicon layer 31 and the nitride pattern 27. As shown in FIG. 5 the spacer polysilicon layer 33 and the gate polysilicon layer 31 are etched to the gate electrode pattern using a vertical etching method. A blanket N+ source/drain implant using arsenic with an ion beam 45 of about $5 \times 10^{15}$ ions/cm² at about 50,000 electron volts is used to form the N+ source/drain regions 35. The gate polysilicon 31, the spacer polysilicon 33, and the nitride pattern 27 prevent the ion beam 45 from doping the region below the gate structure 25 which remains N−.

Figure 6:
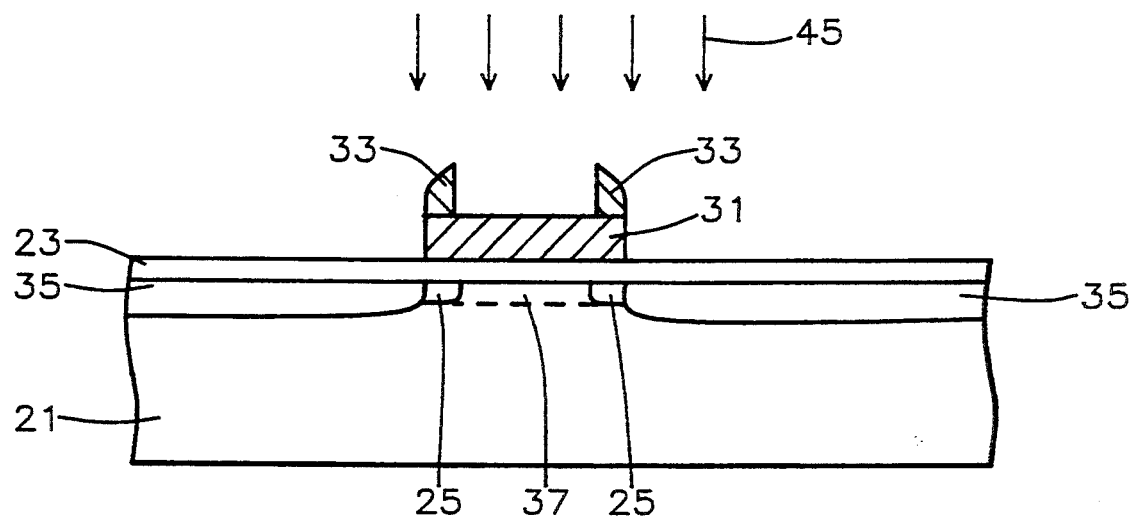
FIG. 6 is a cross sectional view of the device with the gate structure completed showing the cavity in the gate structure and the self aligned boron channel implantation.

As shown in FIG. 6 the nitride is then stripped leaving the gate cavity structure with spacer polysilicon 33 formed on the edges of the gate polysilicon 31. The P− channel area 37 is then formed using a self aligned channel implant through the gate cavity structure with a boron ion beam 47, directed to the gate cacity structure, of about $3 \times 10^{13}$ ions/cm² at about 70,000 electron volts. The spacer polysilicon 33 preserves the doping level of the N− regions 25 directly below the spacer polysilicon.

Figure 7:
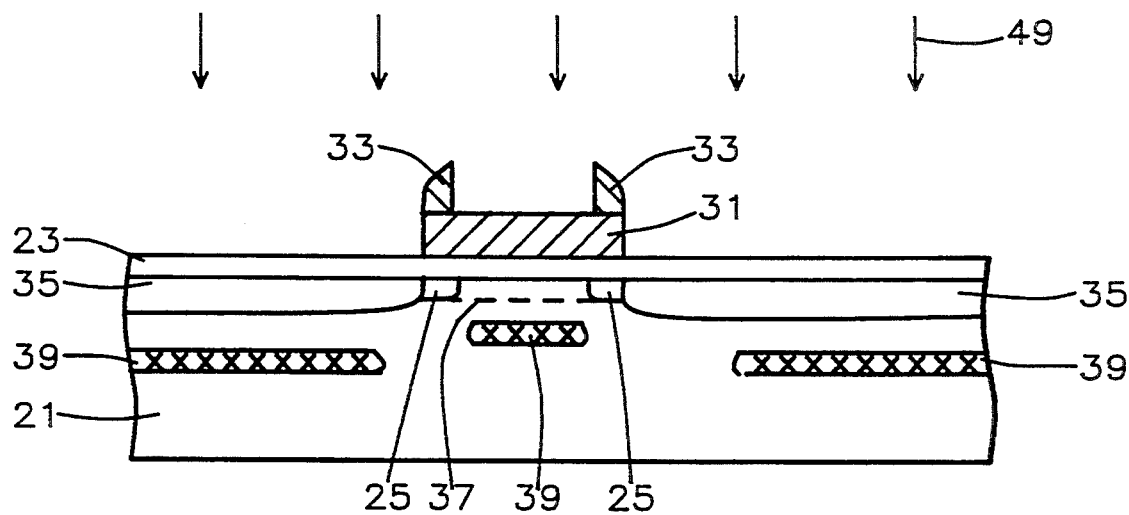
FIG. 7 is a cross sectional view of the device with completed source/drain and channel regions showing the deep boron implantation.

FIG. 7 shows the formation of the deep boron implant regions 39 using a boron ion beam 49 of about $6 \times 10^{11}$ ions/cm² at about 160,000 electron volts. The deep boron implantation is also self aligned with the gate cavity structure. The spacer polysilicon prevents the formation of deep boron implant regions directly below the spacer polysilicon. A device passivation layer is then formed on the device surface and electrical contacts are formed to the gate electrode and the source and drain regions.

FIG. 1 shows the completed device with a device passivation layer 53 and source/drain contacts 51. The gate contact is out of the plane of the figure. The extension of the N− source/drain areas 25 under the edge of the gate electrode 31 forms a fully overlapped Light-Doped-Drain which has improved device characteristics for submicron devices. The deep boron implant P− regions 39 improve the punch through voltage and prevent punch through in short channel devices. The deep boron implant P− regions 39 do not contact the N+ source/drain regions 35 so the implant dose will not increase the body effect.

While the invention has been particularly shown and described with reference to the preferred embodiments thereof, it will be understood by those skilled in the art that various changes in form and details may be made without departing from the spirit and scope of the invention.

What is claimed is:

1. A method of forming a MOSFET structure, comprising the steps of:

providing a silicon substrate with a gate oxide layer formed on the surface of said silicon substrate;

doping said silicon substrate using ion implantation;

forming a first polysilicon layer on the surface of said gate oxide layer;

forming a nitride layer on the surface of said first polysilicon layer;

forming a channel pattern in a layer of photoresist on the surface of said nitride layer;

etching said channel pattern in said nitride layer and removing said photoresist layer;

forming a second polysilicon layer on the surface of said first polysilicon layer and said channel pattern in said nitride layer;

etching said second polysilicon layer to form spacers of second polysilicon at the edges of said channel pattern in said nitride layer;

etching said first polysilicon layer so that said first polysilicon remains directly under said channel pattern in said nitride layer and said spacers of second polysilicon;

doping the areas of said silicon substrate which are not covered by said first polysilicon using ion implantation to form a source and a drain;

removing said nitride layer;

doping the areas of said silicon substrate which are not covered by said first polysilicon and said second polysilicon using ion implantation; and forming deeper than said previous implantation of areas not covered by said first polysilicon and said second polysilicon ion implant regions by doping the areas of said silicon substrate which are not covered by said first polysilicon and said second polysilicon using ion implantation.

2. The method of claim 1 wherein said first ion implant method is a phosphorus ion implant using an ion beam of about $3 \times 10^{13}$ ions/cm² at about 50,000 electron volts.

3. The method of claim 1 wherein said source/drain ion implant method is an arsenic ion implant using an ion beam of about $5 \times 10^{15}$ ions/cm² at about 50,000 electron volts.

4. The method of claim 1 wherein said channel ion implant method is a boron ion implant using an ion beam of about $3 \times 10^{13}$ ions/cm² at about 70,000 electron volts.

5. The method of claim 1 wherein said deep ion implant method is a boron ion implant using an ion beam of about $6 \times 10^{11}$ ions/cm² at about 160,000 electron volts.

6. The method of claim 1 wherein said first polysilicon layer has a doping concentration between about $1 \times 10^{18}/cm^3$ and $1 \times 10^{21}/cm^3$ with a thickness of about 1000 Angstroms.

7. The method of claim 1 wherein said second polysilicon layer has a doping concentration between about $1 \times 10^{18}/cm^3$ and $1 \times 10^{21}/cm^3$ with a thickness of about 2000 Angstroms.

8. The method of claim 1 wherein said gate oxide layer is $SiO_2$ with a thickness of about 150 Angstroms.

9. The method of claim 1 wherein said nitride layer is $Si_3N_4$ with a thickness of about 2000 Angstroms.

10. The method of claim 1 further comprising the steps of:

forming a passivation layer over the surface of the structure;

forming electrical contacts to the gate electrode; and forming electrical contacts to the source and drain regions.

* * * * *